(12) United States Patent
Unnikrishnan et al.

(10) Patent No.: US 12,396,269 B2
(45) Date of Patent: Aug. 19, 2025

(54) TRANSLUCENT PHOTOVOLTAIC DEVICE, TRANSLUCENT PHOTOVOLTAIC PRODUCT AND METHOD OF MANUFACTURING THE SAME

(71) Applicant: Nederlandse Organisatie voor toegepast-natuurwetenschappelijk onderzoek TNO, 's-Gravenhage (NL)

(72) Inventors: Sandeep Unnikrishnan, Veldhoven (NL); Yulia Galagan, Taipei (TW); Henri Fledderus, Eindhoven (NL); Hieronymus Antonius Josephus Maria Andriessen, Beerse (BE); Herbert Lifka, Eindhoven (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 165 days.

(21) Appl. No.: 17/786,829

(22) PCT Filed: Dec. 18, 2020

(86) PCT No.: PCT/NL2020/050809
§ 371 (c)(1),
(2) Date: Jun. 17, 2022

(87) PCT Pub. No.: WO2021/125963
PCT Pub. Date: Jun. 24, 2021

(65) Prior Publication Data
US 2023/0352607 A1 Nov. 2, 2023

(30) Foreign Application Priority Data
Dec. 19, 2019 (EP) .................................. 19218018

(51) Int. Cl.
*H10F 19/37* (2025.01)
*H10F 71/00* (2025.01)
(Continued)

(52) U.S. Cl.
CPC ......... *H10F 19/37* (2025.01); *H10F 71/1375* (2025.01); *H10F 77/147* (2025.01); *H10K 30/50* (2023.02)

(58) Field of Classification Search
CPC . H01L 31/18; H01L 31/1892; H01L 31/1896; H01L 31/206; H10F 19/37; H10F 77/147
See application file for complete search history.

(56) References Cited

U.S. PATENT DOCUMENTS 5,364,481 A * 11/1994 Sasaki ............... H01L 31/03921
136/258
2002/0189663 A1* 12/2002 Nagasawa ....... H01L 31/022425
257/E31.038
(Continued)

OTHER PUBLICATIONS

European Patent Office, International Search Report in corresponding International Application No. PCT/NL2020/050809, dated Mar. 16, 2021 (4 pages).

*Primary Examiner* — Christina Chern
(74) *Attorney, Agent, or Firm* — Leydig, Voit & Mayer, Ltd.

(57) ABSTRACT

Translucent photovoltaic product, method of manufacturing the same and manufacturing apparatus. The method comprises: depositing a stack of layers on a carrier substrate, the stack comprising a first electrode layer, a photovoltaic layer and a second electrode layer; cutting through the substrate with the stack of layers to form a first and a second mutually disjoint sections; separating the first and the second section from each other; laminating the first section and the second section with a respective further substrate at a side opposite the carrier substrate to form a respective first and second
(Continued)

photovoltaic device; and assembling the photovoltaic product from the first photovoltaic device and the second photovoltaic device, wherein the first and the second sections are mutually complementary comb shaped structures and wherein the second photovoltaic device is arranged in a second plane parallel to and in front of a first plane of said first photovoltaic device.

8 Claims, 9 Drawing Sheets

(51) Int. Cl.
  *H10F 77/14* (2025.01)
  *H10K 30/50* (2023.01)

(56) References Cited

U.S. PATENT DOCUMENTS

| | | | |
|---|---|---|---|
| 2003/0121542 A1* | 7/2003 | Harneit | H01L 31/0543 |
| | | | 257/E27.125 |
| 2007/0065962 A1 | 3/2007 | Pichler | |
| 2010/0307567 A1 | 12/2010 | Huang | |
| 2012/0204933 A1 | 8/2012 | Iwade et al. | |
| 2015/0129019 A1 | 5/2015 | Huang | |

\* cited by examiner

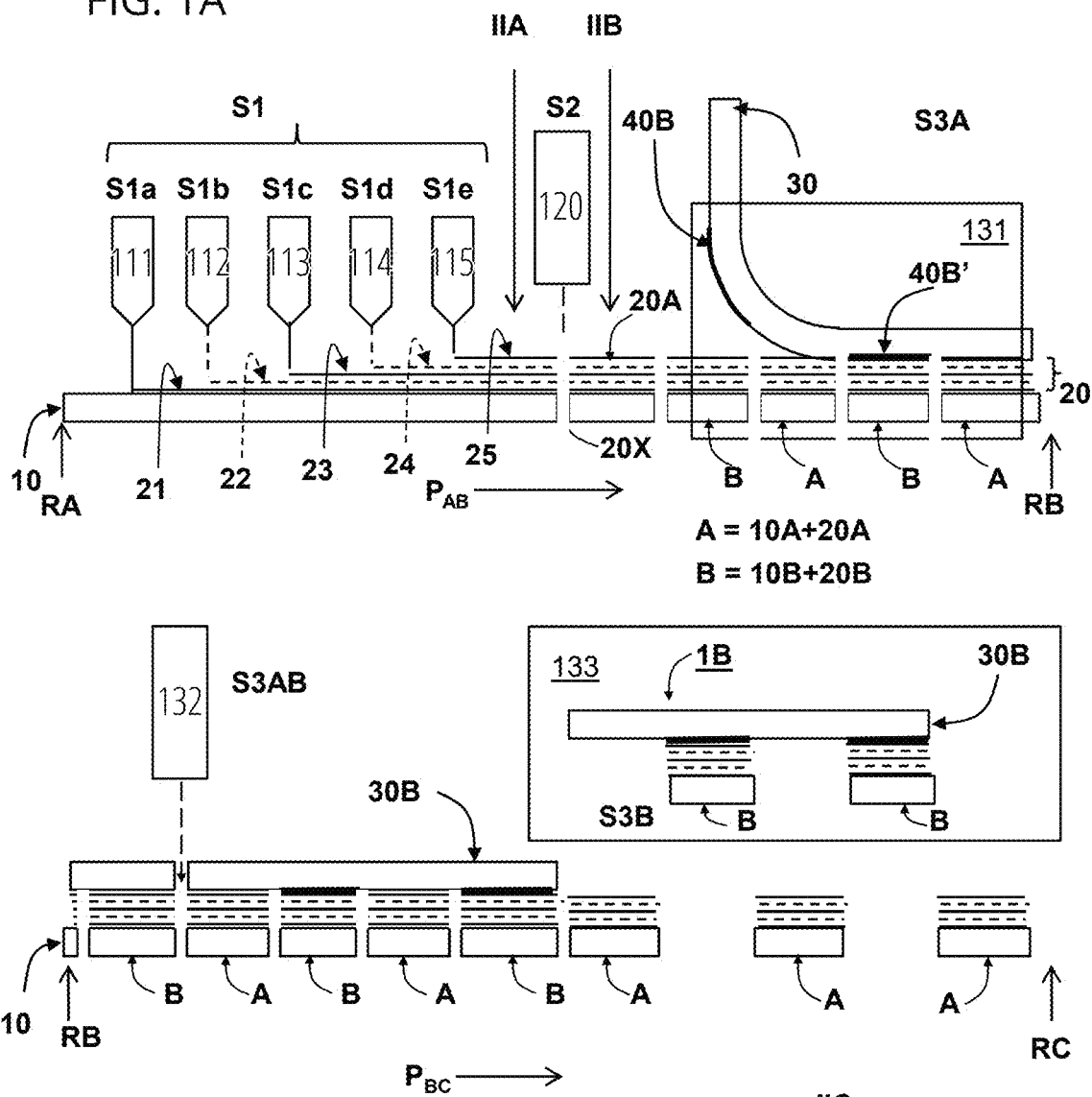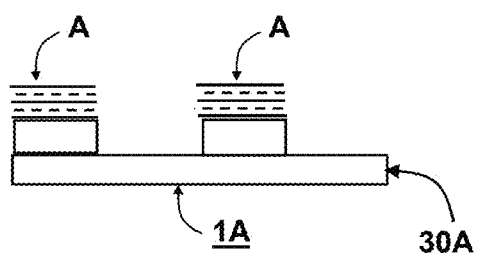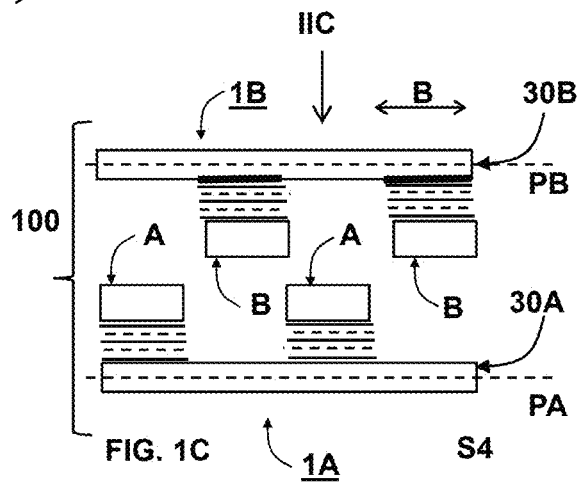

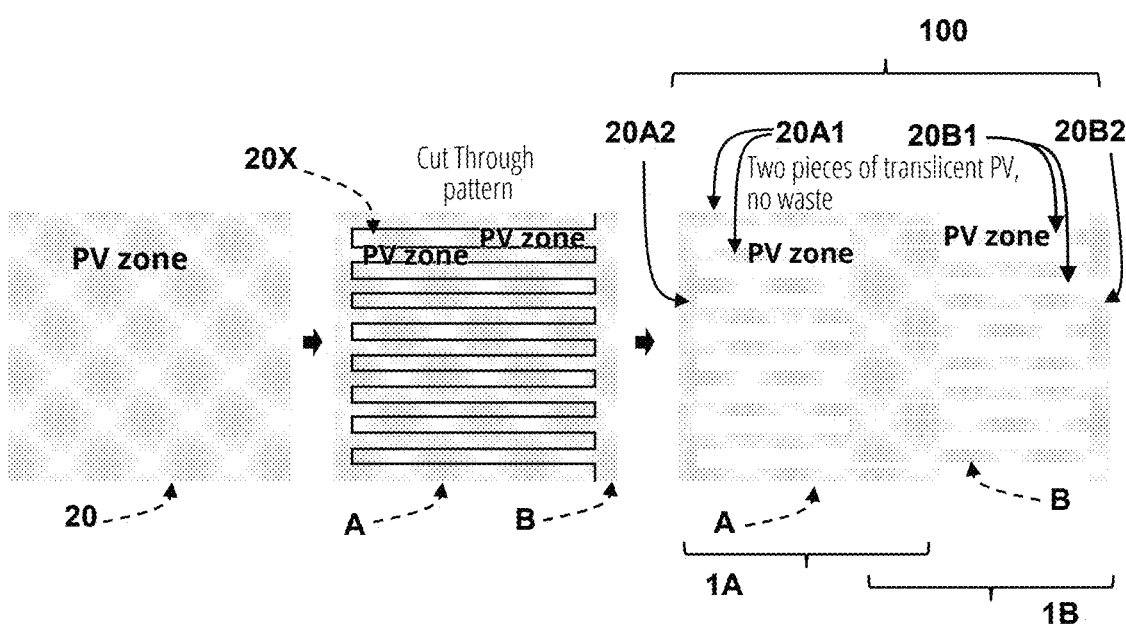
FIG. 2A (S1)   FIG. 2B (S2)   FIG. 2C (S4)

FIG. 5  S2A

TRANSLUCENT PHOTOVOLTAIC DEVICE, TRANSLUCENT PHOTOVOLTAIC PRODUCT AND METHOD OF MANUFACTURING THE SAME

CROSS-REFERENCE TO RELATED APPLICATIONS

This patent application is a U.S. National Phase of PCT International Application No. PCT/NL2020/050809, filed Dec. 18, 2020, which claims priority to European Application No. 19218018.0, filed Dec. 19, 2019, which are both expressly incorporated by reference in their entireties, including any references contained therein.

BACKGROUND

The present invention pertains to a translucent photovoltaic device.

The present invention further pertains to a translucent photovoltaic product comprising a plurality of translucent photovoltaic devices.

The present invention still further pertains to a method of manufacturing the device and the product.

A photovoltaic device typically comprises a photovoltaic stack comprising at least a photovoltaic layer sandwiched between a first electrode and a second electrode.

Translucent photovoltaic devices are widely applicable in situations wherein it is desired to moderate the strength of solar radiation and to convert the absorbed solar radiation into electric energy.

Photovoltaic products are known for this purpose wherein the photovoltaic stack is interrupted by a pattern of translucent sections. The photovoltaic stack may be provided for example in the pattern of a comb, wherein the spaces between the teeth of the comp are of a translucent material.

Current methods of manufacturing include a first stage wherein the layers of the photovoltaic stack are deposited homogeneously over the full area of the device and a subsequent stage wherein the photovoltaic stack is locally removed to provide for the pattern of translucent sections. It is a disadvantage that a substantial amount of valuable material is lost.

SUMMARY

It is an object of the present disclosure to provide a method of manufacturing a translucent photovoltaic device that at least mitigates this disadvantage.

This is achieved by the measures of independent claim 1. Contrary to the known method, an additional step is provided of cutting through the substrate with the stack of layers to form a plurality of laterally disjoint sections wherein an amount of material removed by said cutting is at least 10 times smaller than an amount of material remaining in the plurality of sections. This additional step makes it possible to subsequently separate the plurality of sections from each other. The separated sections can then each be used in a subsequent process, so that a loss of material is substantially lower than the loss that occurs in a conventional process, wherein the material which is not part of the sections to be manufactured is wasted. A very efficient way to perform the additional step is by laser cutting. This approach is also advantageous, in that it allows execution of the cutting step while the substrate with the stack is moving, e.g. in a roll to roll process. Another approach is to cut the substrate with the stack in a mechanical manner, an example of which is presented below in more detail. Whereas a cutting step according to this approach is more difficult to apply to a moving product, it is advantageous in that the separation of the sections can be achieved with a substantially lower loss of material. When applying laser cutting, the width of the track may be in the order of a few micron to a few tens of microns, whereas when using a mechanical cutting tool, the width of the track may be reduced to the order of magnitude of a micron. Therewith, given a target loss of material which is at most 10% of the amount of material remaining in the plurality of sections, the use of a mechanical cutting tool enables a more fine-grained partitioning.

The present disclosure further provides a translucent photovoltaic product comprising a pair of photovoltaic devices obtained with the improved method. The first photovoltaic device therein has first section on a first further substrate portion and the second photovoltaic device has the second section on a second further substrate portion. The first section and the second section have a substantially complementary comb-shape. In the photovoltaic product the first photovoltaic device may be arranged in a first plane and the second photovoltaic device may be arranged in a second plane parallel to and in front of a first plane. In particular, the first photovoltaic device and the second photovoltaic device may be movably arranged with respect to each other along at least one direction defined by the first plane. Therewith a translucency of the photovoltaic product can be controlled by a relative movement of the first photovoltaic device and the second photovoltaic device.

The present disclosure further discloses a manufacturing apparatus to manufacture a translucent photovoltaic device that comprises one or more deposition devices, a cutting station and separation means.

The one or more deposition devices are provided to deposit a stack of layers, comprising at least a first electrode layer, a photovoltaic layer and a second electrode layer on a carrier substrate.

The cutting station is provided to cut through the substrate with the stack of layers to form a plurality of laterally disjoint sections, wherein an amount of material removed by said cutting is at least 10 times smaller than an amount of material remaining in the plurality of sections.

The separation means is to separate the plurality of sections from each other.

BRIEF DESCRIPTION OF THE DRAWINGS

These and other aspects are described in more detail with reference to the drawing. Therein:

FIG. 1A schematically shows an exemplary method of manufacturing a translucent photovoltaic device;

FIG. 1B schematically shows a translucent photovoltaic device obtained with the method;

FIG. 1C schematically shows a photovoltaic product obtained with the method;

FIG. 2A is a top view according to IIA in FIG. 1A, that schematically shows a semi-finished device obtained after a first step of the method;

FIG. 2B is a top view according to IIB in FIG. 1A, that schematically shows a semi-finished device obtained after a second step of the method;

FIG. 2C is a top view according to IIC in FIG. 1B, that schematically shows a semi-finished device obtained after a fourth step of the method;

FIGS. 5, 5A and 5B illustrate in more detail a step in an embodiment of the method;

DETAILED DESCRIPTION OF EMBODIMENTS

Figure 3:
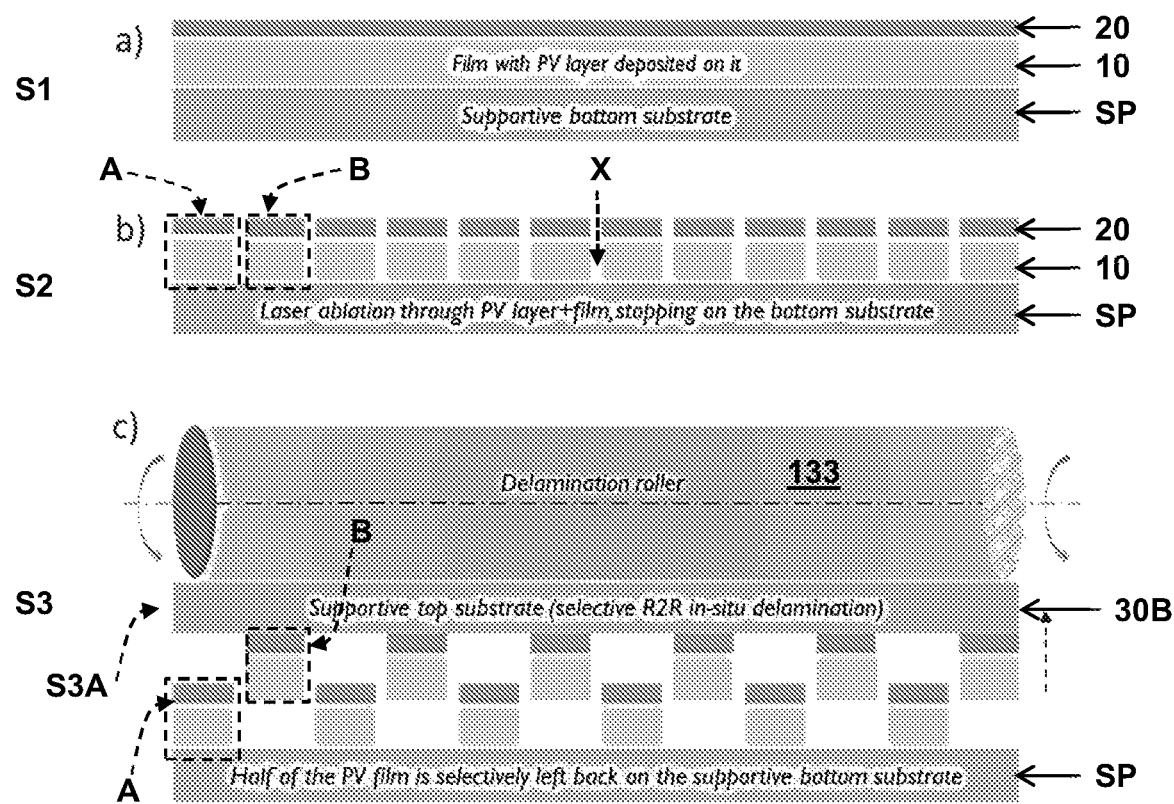
FIG. 3 shows another exemplary method of manufacturing a translucent photovoltaic device.

Like reference symbols in the various drawings indicate like elements unless otherwise indicated.

FIG. 1A. schematically shows a method of manufacturing a translucent photovoltaic device. In the embodiment shown the method is performed in a roll to roll process. An upper portion of FIG. 1A shows a part RA-RB of the roll to roll process. A lower portion shows a subsequent part RB-RC of the roll to roll process. Alternatively the method may be performed batch-wise. It may further be contemplated to perform some of the steps in a roll to roll process and others according to a batch procedure.

The method shown in FIG. 1A comprises depositing S1 a stack 20 of layers on a carrier substrate 10. Dependent on the device specifications and the embodiment of the method used, the carrier substrate 10 may for example be a polymer like PET or PEN or PI, a metal foil or a composite, e.g. comprising one or more layers of a metal and one or more layers of a polymer. The stack 20 comprises at least: a first electrode layer 21, a photovoltaic layer 23, and a second electrode layer 25. The first electrode layer 21 may be provided as a cathode and the second electrode layer 25 as an anode or reversely. As becomes apparent from the description below other layers may be present below, between and/or on top of these three layers. In embodiments a layer may comprise a plurality of sub-layers.

In the embodiment shown, a first deposition device 111 is used in a sub-step S1a to deposit a first electrode layer 21. A second deposition device 112 is used in a sub-step S1b to deposit a first charge-carrier transport layer 22. A third deposition device 113 is used in a sub-step S1c to deposit a photovoltaic layer 23. A fourth deposition device 114 is used in a sub-step S1d to deposit a second charge-carrier transport layer 24. A fifth deposition device 115 is used in a sub-step S1e to deposit a second electrode layer 25. The upper-surface of the carrier substrate 10 with stack 20 as seen in direction IIA is schematically shown in FIG. 2A. It is noted that various types of deposition devices are available to perform the first step. Examples thereof are vapor deposition methods such as thermal evaporation, e-beam evaporation, sputtering, magnetron sputtering, reactive sputtering, reactive evaporation, etc. and all kinds of chemical vapor deposition methods such as thermal chemical vapor deposition (CVD), photo assisted chemical vapor deposition (PACVD), plasma enhanced chemical vapor deposition (PECVD), (e.g. E-beam PVD, Sputter PVD), (spatial) Atomic Layer Deposition ((s)ALD). Alternatively or additionally, coating techniques may be applied. Examples thereof are spin coating, slot-die coating, kiss-coating, hot-melt coating, spray coating, etc. and all kinds of printing techniques, such as inkjet printing, gravure printing, flexographic printing, screen printing, rotary screen printing, etc. In some examples a single deposition apparatus may be employed to subsequently deposit mutually different layers. Also deposition apparatuses are available that are capable of directly depositing a plurality of layers.

In this roll to roll process, the carrier substrate 10 with the stack 20 is continuously transported in a direction $P_{AB}$ and is therewith guided along a laser-cutting station 120, where the substrate 10 with the stack of layers 20 is cut through (S2) to form a plurality of laterally disjoint sections A (10A+20A) and B(10B+20B). Therewith the stack of layers is supported by a support, e.g. a belt (not shown). Alternatively, mechanical means may be applied, as shown for example in FIG. 5, 5A, 5B. The upper-surface of the carrier substrate 10 with stack 20 as seen in direction IIB, subsequent to step S2 is schematically shown in FIG. 2B. As shown further in FIG. 2C, the plurality of sections comprise a first section A and a second section B that form a pair of interdigitated structures. In this example section 20A is formed as comb-structure having parallel strips 20A1 extending from a base 20A2. Similarly, section 20B is formed as comb-structure having parallel strips 20B1 extending from a base 20B2. Only a minor amount 20X of material is removed in this cutting step. The amount 20X which is lost is at least 10 times smaller than an amount of material remaining in the plurality of sections. For example the parallel strips 20A1, 20B1 may have a width of about 50 micron and the trenches 20X between them may have a width in the order of 1 micron.

As a subsequent step S3, the plurality of sections A, B are separated from each other. In the embodiment shown, this is achieved with the following sequence of sub-steps.

A lamination unit 131, arranged further stream-downwards in the transportation direction $P_{AB}$ of the roll to roll process, is provided to laminate (step S3A) the one or more of the sections to be separated with a further substrate 30. The further substrate 30 is provided with an adhesive coating 40B, 40B' in a pattern corresponding to that of one sections, here section B.

The carrier substrate 10 with the stack 20 having laminated thereon the further substrate 30 is then transported to further laser cutting station 132 which performs a step S3AB, wherein the further substrate 30 is partitioned into further substrate sections 30B. Alternatively, the further substrate 30 may be laminated already as further substrate sections 30B, therewith obviating the step S3AB. Further stream downwards, in the direction $P_{BC}$, a delamination device 133 is provided that performs a sub-step S3B wherein the further substrate sections 30B having adhered thereto the sections B are separated from the sections A. In an embodiment, the further substrate 30 may be continuous and the further substrate sections 30B having adhered thereto the sections B may be partitioned after delaminating. As shown in FIG. 1A, a further substrate section 30B having adhered thereto second sections B forms a photovoltaic device 1B. Likewise a sections A can be separated and adhered to a further substrate 30A to form a photovoltaic device 1A, as shown in FIG. 1B. The photovoltaic devices 1A, 1B may be subjected to further processing steps, for example to provide one or more protection layers, to provide a getter material, to provide electrical connections and/or to provide electric bypass elements.

FIG. 3 further illustrates an embodiment of the method wherein the upper portion (a) of the figure shows the result of the first step S1, the central portion (b) of the figure shows the result of the second step S2, and the lower portion (c) of FIG. 3 shows the third step S3. The delamination device 133 used therein is a delamination roller. In this third step S3, the further substrate 30B is continuous. After being delaminated together with the sections B, from the support SP with the sections A, the further substrate 30B may partitioned.

FIG. 1C shows a further method step S4, wherein a photovoltaic product 100 is assembled from the first photovoltaic device 1A and the second photovoltaic device 1B. The second photovoltaic device 1A is arranged in a second plane PB, indicated as the center plane of the further substrate 30B parallel to and in front of a first plane PA, indicated as the center plane of the further substrate 30A of the first photovoltaic device 1A.

FIG. 1C, further shows that the first photovoltaic device 1A and the second photovoltaic device 1B may be assembled in step S4 so as to be movably arranged with respect to each other. As shown in FIG. 1C, the second photovoltaic device 1B can be moved with respect to the first photovoltaic device 1A along a direction B that is aligned with the plane PA.

Figure 4:
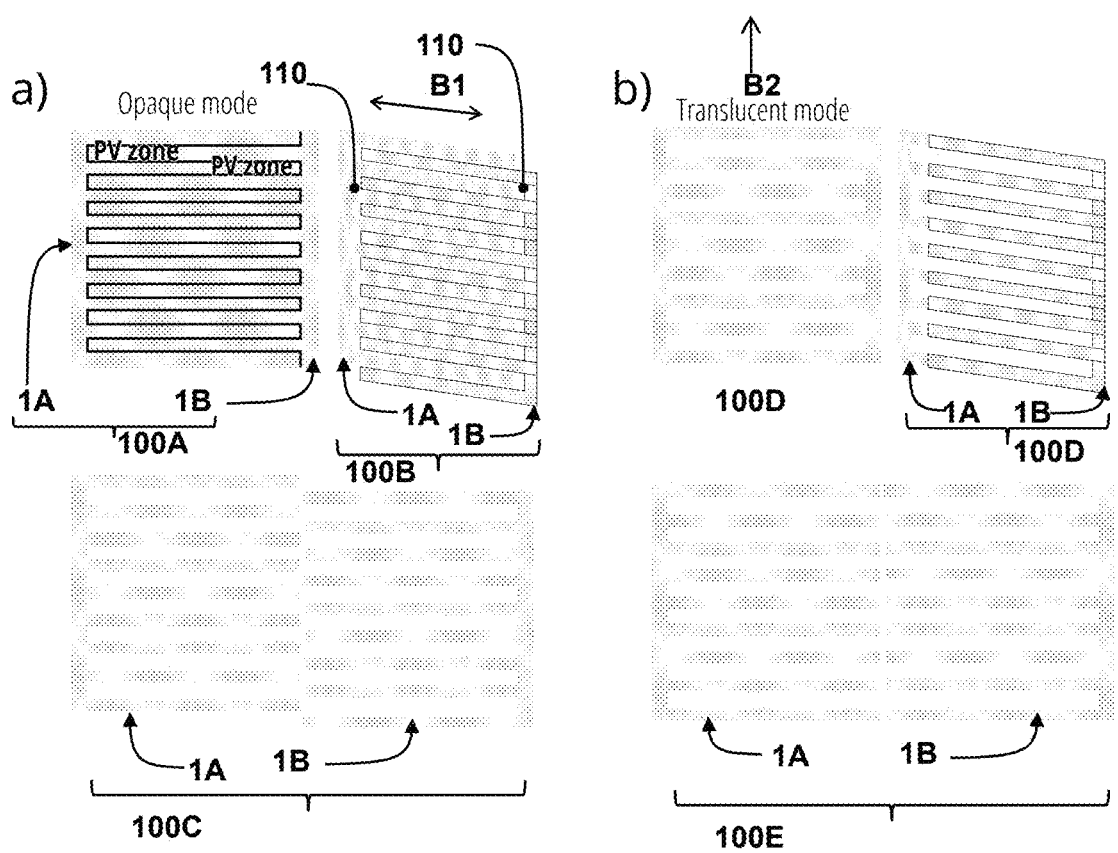
FIG. 4 shows various configurations of translucent photovoltaic devices in a photovoltaic product.

FIG. 4 shows five exemplary configurations 100A, 100B, 100C, 100D, 100E of the first photovoltaic device 1A and the second photovoltaic device 1B in the photovoltaic product 100 obtained in step S4. In exemplary configurations 100A, the parallel strips 20A1 of photovoltaic device 1A (See FIG. 2C) fully cover the spaces between the parallel strips 20B1 of photovoltaic device 1B. Therewith the configuration 100A is an opaque mode of photovoltaic product 100, and almost all (solar) radiation incident on the surface formed by the photovoltaic product 100. is captured for conversion into electrical energy. In configuration 100B, the photovoltaic device 1B is moved slightly in the direction B1 of the parallel strips 20B1, so that openings 110 are formed that transmit light. The total surface area of the photovoltaic product 100 is enlarged and the surface area available for capturing solar radiation for opto-electrical conversion remains the same. In configuration 1C, the second photovoltaic device 1B is shifted further away in the direction B1, so that the total surface area of the photovoltaic product 100 is doubled. The surface area available for capturing solar radiation for opto-electrical conversion remains the same and about a same surface area is available for transmitting light. A photovoltaic product 100 which is configurable by movement of photovoltaic device 1B in the direction B1 can therewith be used as a roof like element of which the total surface can be adapted without changing the surface area available for power production.

In configuration 100D, the photovoltaic device 1B is moved relative to photovoltaic device 1A in a direction B2, which is in a direction transverse to direction B1, but also aligned with the planes PA, PB. With a relatively small movement in the direction B2, the photovoltaic product 100 becomes translucent, without significantly changing its surface area. About half the surface area becomes available for transmission of solar radiation in configuration 100D.

Hence a photovoltaic product 100 being configurable by a relative translation of the photovoltaic device 1B relative to photovoltaic device 1A in a direction B2 is suitable for applications wherein it is required that the translucence of the photovoltaic product can be controlled, without significantly changing the total surface area of the photovoltaic product.

In a still further embodiment of the photovoltaic product 100, the photovoltaic device 1B can be moved relative to photovoltaic device 1A in a direction B2, in any direction aligned with the planes PA, PB. Such a photovoltaic product 100 may for example be reconfigured from configuration 100C to configuration 100E by a translation in the direction B2 or from a configuration 100D to configuration 100E by a translation in the direction B1. Therewith this further embodiment of the photovoltaic product 100 is suitable for a wide range of applications.

Figure 5A:
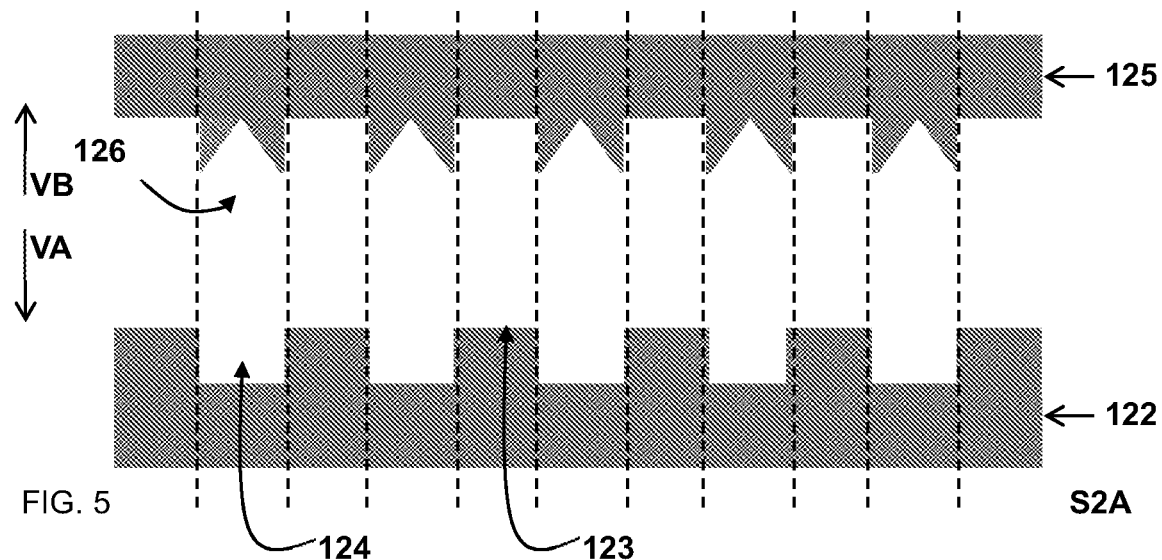
Figure 5B:
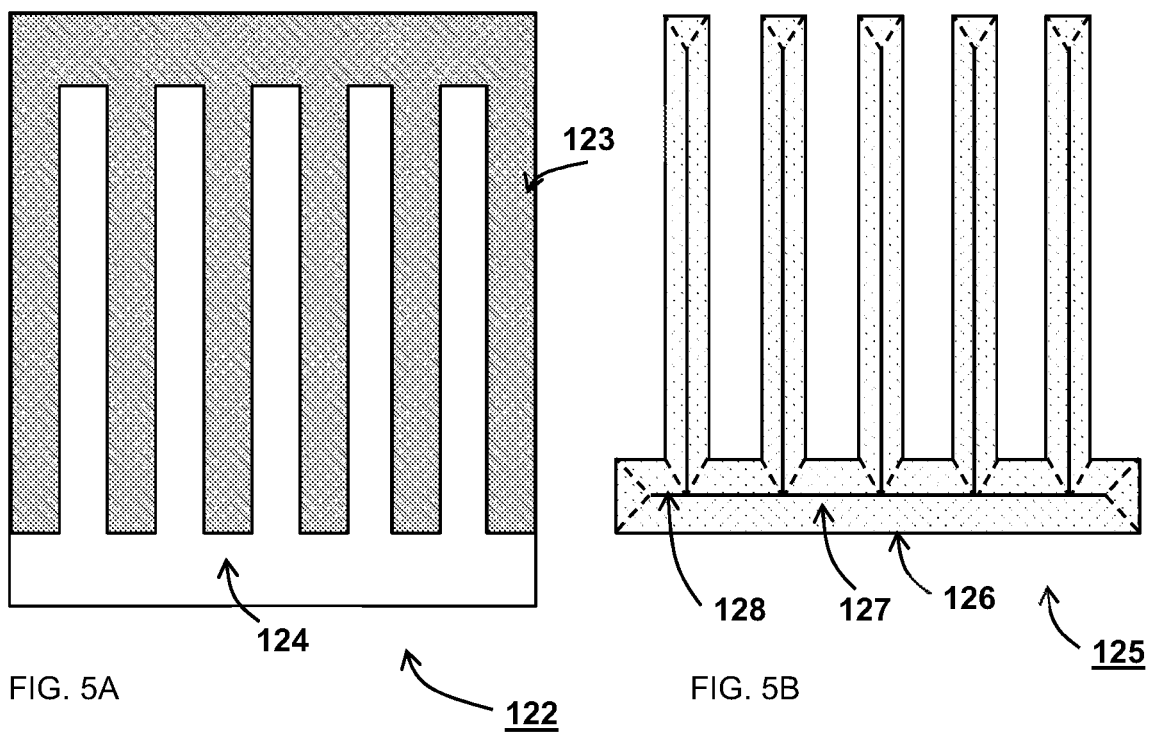

FIG. 5, 5A, 5B shows an exemplary mechanical cutting tool 122, 125 which is suitable for use in step S2 of the method. The cutting tool comprises an anvil 122 of which a top-view according to VA in FIG. 5 is shown in FIG. 5A, and of which a cutter 125 of which a bottom-view according to VB in FIG. 5 is shown in FIG. 5B. The cutter 125 has a form complementary to that of a recession 124 in the anvil. More in particular, the cutter 125 has a cutting edge 126 that faces an edge of the recession 124 in the anvil 122, and the cutter has a recessed portion 127 within the cutting edge 126. The depth of the recessed portion 127 gradually increases in a direction from the cutting edge 126 towards a centerline 128 within opposing parts of the cutting edge 126.

Figure 6A:
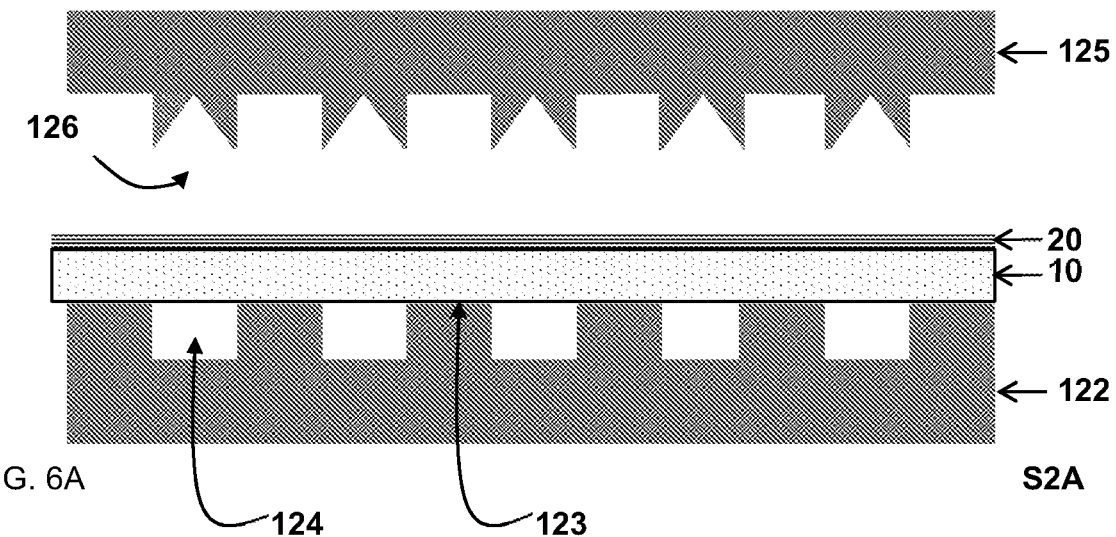
FIG. 6A-6F illustrate in more detail another step in an embodiment of the method.

FIG. 6A-6D shows a step of cutting S2 through the stack of layers to form a plurality of laterally disjoint sections A, B in an embodiment of the method using the tool of FIG. 5, 5A, 5B. As shown therein, a substrate 10 with the stack 20 is provided between the anvil 122 and the cutter 125. FIG. 6A shows a first stage S2A of step S2, wherein the substrate 10 with stack 20 is positioned on the anvil 122. There it rests on the surface 123 of the anvil 122 between the recession 124. The cutter 125 does not contact the substrate 10 with stack 20.

Figure 6B:
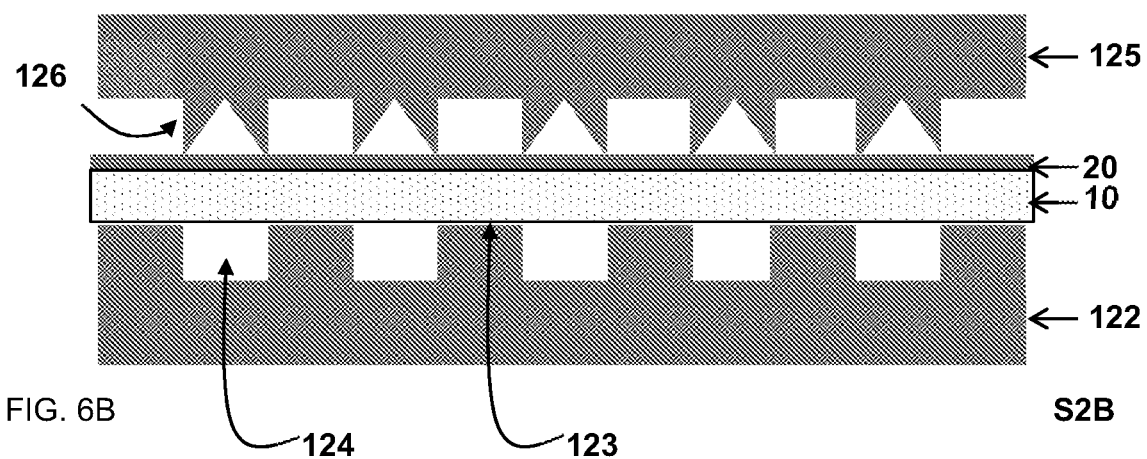
Figure 6C:
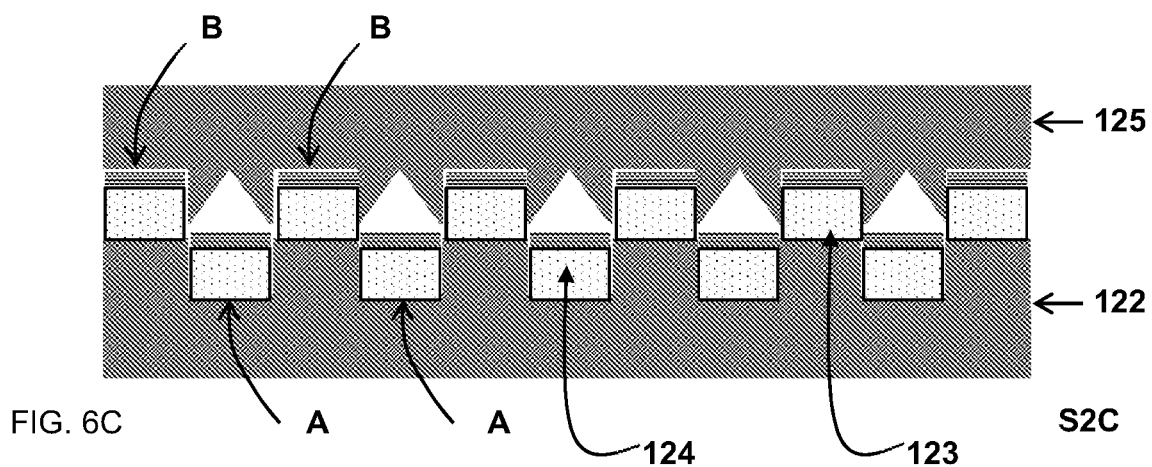

FIG. 6B shows a second stage S2B of step S2. Therein the cutter 125 is moved down towards the anvil 122, so that its cutting edge 126 touches the surface of the stack 20. During this movement the cutting edge 126 of the cutter 125 gradually cuts through the substrate 10 with stack 20 so that a first and a first section are formed, wherein section A is pressed into the recession 124 of the anvil 122, whereas section B remains at the level of surface 123 of the anvil 122. This final stage S2C is illustrated in FIG. 6C.

Figure 6D:
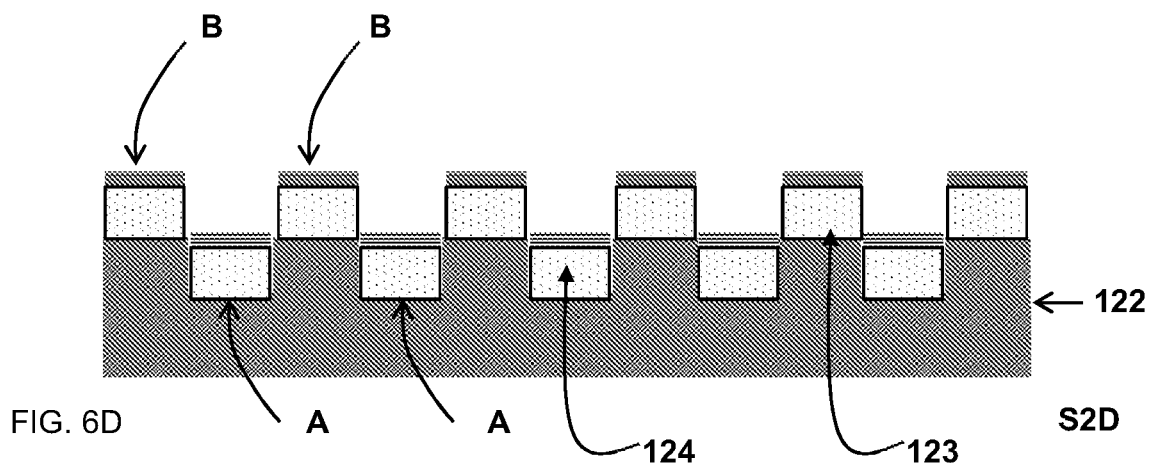
Figure 6E:
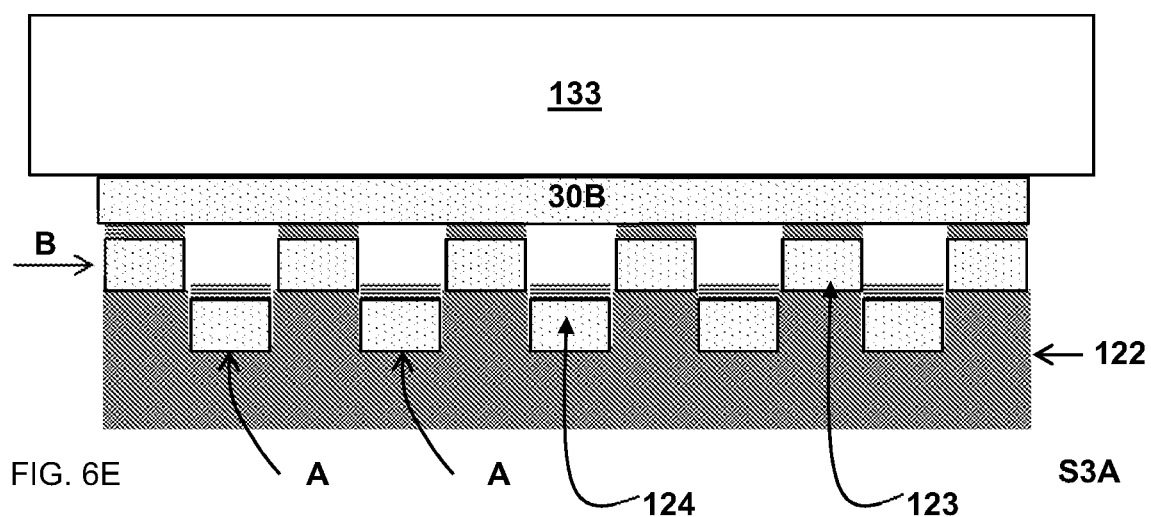

Now the cutter 125 is removed in stage S2D of step S2, shown in FIG. 6D, so that the two sections A, B can be accessed for further processing steps. FIG. 6E shows an exemplary further processing step, S3A, which is a first stage of separation step S3. Therein section B (of substrate 10 and stack 20) is adhered to further substrate 30B. For this purpose an adhesive may be provided on the surface of the stack 20 or the surface of the further substrate 30B facing the stack, or both. Any adhesive may be used for this purpose, as only section B comes into contact with the substrate 30 in this stage S3A. The element 133 may be a plate which is pressed against the surface of the further substrate 30B facing away from the section B. It may for example hold the further substrate 30B during the operation by a vacuum created in openings in its surface facing the further substrate 30B. As an alternative the element 133 may be a roller, which adheres the further substrate 30B to section B in a rolling movement.

Figure 6F:
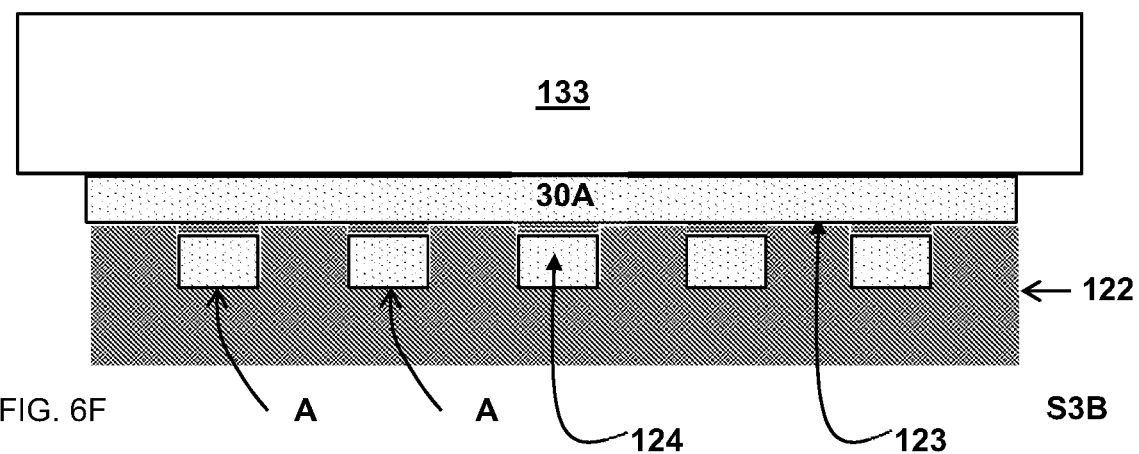

After section B is adhered to further substrate 30B and removed from the anvil 122 in stage S3A of step S3, section A may be processed in a similar manner as shown in FIG. 6F where it is adhered to another further substrate 30A.

Figure 7A:
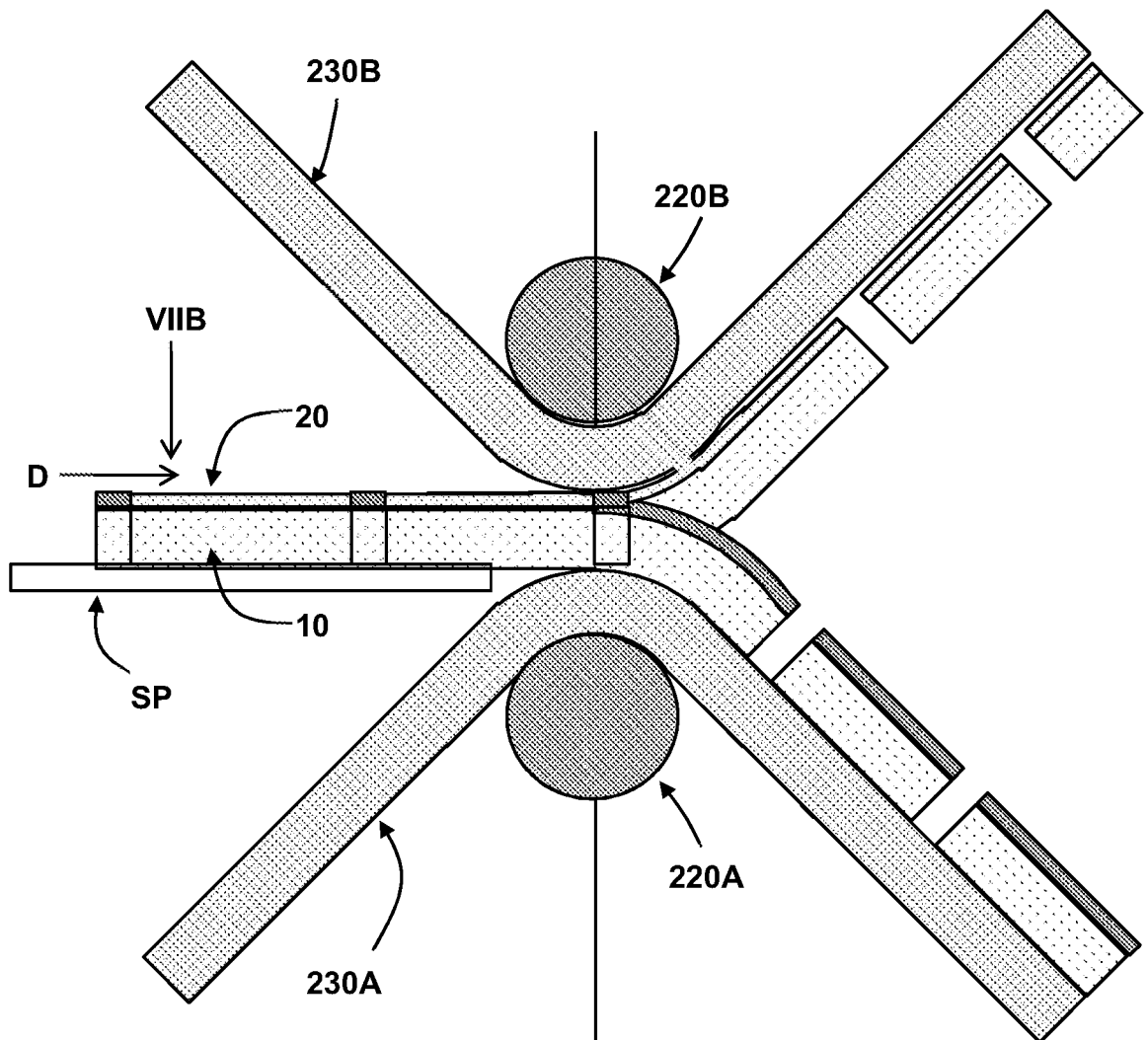
FIGS. 7A and 7B illustrate a further embodiment.
Figure 7B:
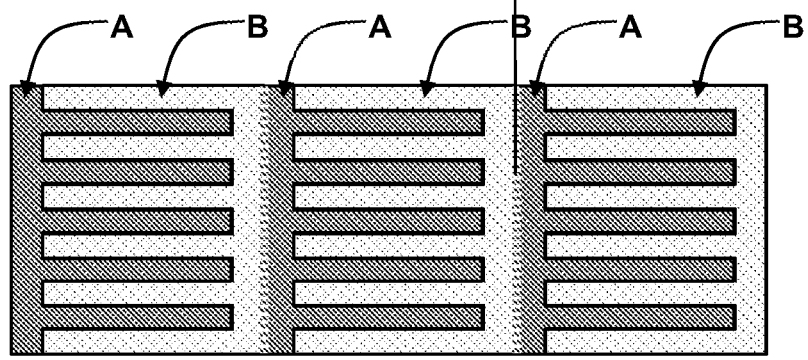

FIGS. 7A and 7B shows step S3 in an embodiment of the method. Therein FIG. 7A show the execution of this step in a side-view, and FIG. 7B shows a top-view of the substrate 10 with stack 20. The substrate 10 with stack 20, which are partitioned into sections A, B in a previous step S2, are supplied in a direction D sliding over a temporary support SP towards a pair of lamination rollers 220A, 220B. The first lamination roller 220A carries a first further substrate 230A that is provided with an adhesive coating having a pattern conformal to that of the sections A. The second lamination roller 220B carries a second further substrate 230B that is provided with an adhesive coating (not-shown) having a pattern conformal to that of the sections B. As a result, the sections A are adhered to the first further substrate 230A, and the sections B are carried to the second further substrate 230B.

Figure 8A:
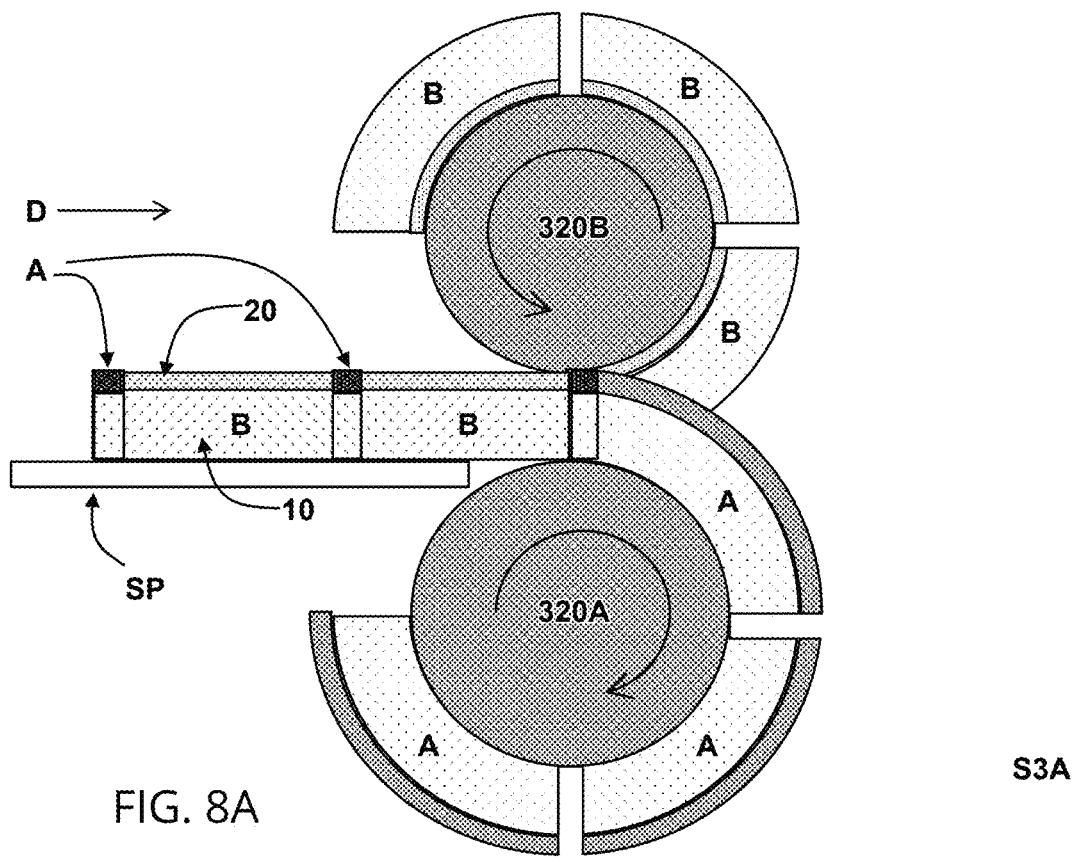
FIGS. 8A and 8B illustrate a still further embodiment.
Figure 8B:
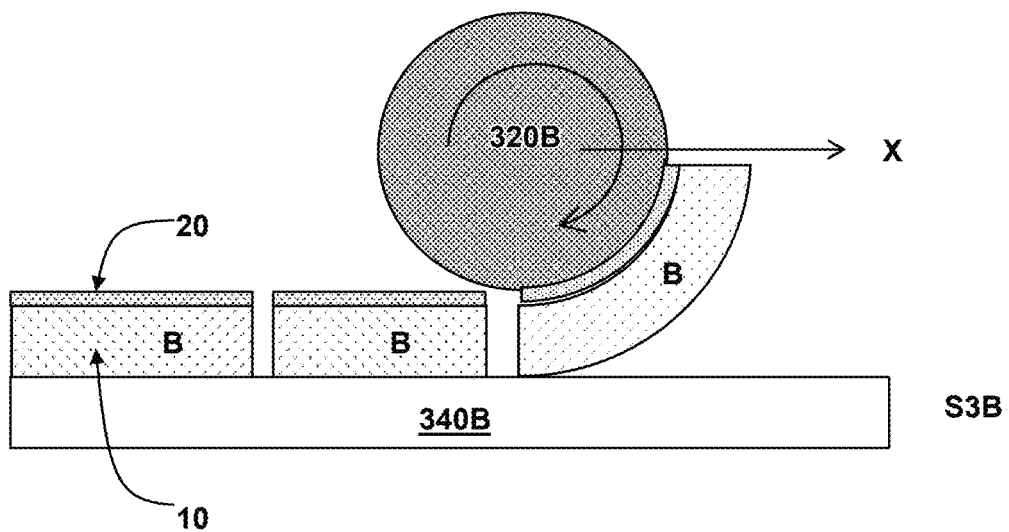

FIGS. 8A and 8B shows step S3 in another embodiment of the method. In a first sub-step S3A, the substrate 10 with stack 20, partitioned into sections A, B are supplied in a direction D sliding over a temporary support SP towards a pair of lamination rollers 320A, 320B. In this case, the sections A and B are directly adhered to lamination rollers 320A and 320B respectively. To that end lamination roller 320A is provided with an adhesive layer (not-shown) of an adhesive of a first type T1, having a pattern conformal to that of the sections A and the adhesive T1 is provided on the surface of the lamination roller 320B with a pattern conformal to that of the sections B. Lamination roller 320A rotates in a clockwise direction to have at its surface a tangential velocity equal to the velocity of the substrate 10 with stack 20 in the direction D. Analogously, lamination roller 320B rotates in a counterclockwise direction to have at its surface a tangential velocity equal to the velocity of the substrate 10 with stack 20. Upon completion of the first sub-step S3A, lamination roller 320A carries one or more partitions A, and lamination roller 320B carries one or more partitions B.

In a subsequent second sub-step S3B, the sections A and B are transferred from the lamination rollers 320A, 320B to a respective target substrate. For example, FIG. 8B shows how three sections B are laminated by the lamination roller 320B onto the target substrate 340B. This may for example be the case in that the lamination roller 320B rotates and translates with a velocity equal to the tangential velocity of the surface of the substrate 10 facing the target substrate 340B in a direction X over the surface of the target substrate 340B. Alternatively, the lamination roller 320B may have its rotation axis at a fixed position and the target substrate 340B may be translated in a direction −X, provided that the relative velocity of the surface of the substrate 10 facing the target substrate 340B is substantially equal to the velocity of the target substrate 340B. The target substrate 340B may be provided with a layer of an adhesive of a second type T2, which exerts an adhesive force on the section B exceeding the adhesive force exerted by the adhesive of the first type T1 provided on the surface of the lamination roller 320B. Alternatively, a same adhesive may be applied on the surface of the lamination roller 320B and the target substrate 340B, and the adhesive on the lamination roller 320B may be weakened in step S3B, for example by heating the lamination roller 320B. In again another embodiment the lamination rollers 320A, 320B may be configured to hold the sections A and B respectively by applying a vacuum to microscopic openings on the surface of the rollers. It is noted that the two step approach demonstrated in FIG. 8A, 8B is very suitable for applications wherein the target substrate, e.g. 340B is a rigid substrate, such as glass.

In the claims the word "comprising" does not exclude other elements or steps, and the indefinite article "a" or "an" does not exclude a plurality. A single component or other unit may fulfill the functions of several items recited in the claims. The mere fact that certain measures are recited in mutually different claims does not indicate that a combination of these measures cannot be used to advantage. Any reference signs in the claims should not be construed as limiting the scope.

The invention claimed is:

1. A translucent photovoltaic product comprising:
   a first section and a second section cut from respective sections of a stack of layers deposited on a carrier substrate, the stack comprising at least: a first electrode layer, a photovoltaic layer and a second electrode layer;
   a first photovoltaic device formed with the first section on a first further substrate portion; and
   a second photovoltaic device formed with the second section on a second further substrate portion,
   wherein the first section and the second section have a substantially complementary comb-shape, the first section comprising first parallel strips having a width W and a space of width S between subsequent ones of the first parallel strips, the second section comprising second parallel strips also having a width W and a space of width S between subsequent ones of the second parallel strips, wherein a ratio (S−W)/W is at most 0.2, and
   wherein the first photovoltaic device is arranged in a first plane and the second photovoltaic device is arranged in a second plane parallel to and in front of the first plane.

2. The translucent photovoltaic product according to claim 1, wherein the first photovoltaic device and the second photovoltaic device are movably arranged with respect to each other along at least one direction defined by the first plane.

3. The translucent photovoltaic product according to claim 2, wherein the first section with which the first photovoltaic device is formed has first parallel strips extending from a first base,
   wherein the second section with which the second photovoltaic device is formed has second parallel strips extending from a second base,
   wherein the first photovoltaic device and the second photovoltaic device are movably arranged with respect to each other at least according to a first direction aligned with the first parallel strips and the second parallel strips allowing the second parallel strips of the second section to cover the spaces between the first parallel strips of the first section to an extent defined by the relative position in the first direction.

4. The translucent photovoltaic product according to claim 2, wherein the first section with which the first photovoltaic device is formed has first parallel strips extending from a first base,
   wherein the second section with which the second photovoltaic device is formed has second parallel strips extending from a second base, and
   wherein the first photovoltaic device and the second photovoltaic device are movably arranged with respect to each other at least according to a second direction transverse to a direction of the first parallel strips and the second parallel strips allowing the second parallel strips of the second section to cover the spaces between the first parallel strips of the first section to an extent defined by the relative position in the second direction.

5. A translucent photovoltaic product comprising: a first photovoltaic device, and a second photovoltaic device,
   wherein the first photovoltaic device and the second photovoltaic device respectively comprise a first section and a second section cut from respective sections of a stack of layers deposited on a carrier substrate, the stack comprising at least: a first electrode layer, a photovoltaic layer and a second electrode layer;
   wherein the first photovoltaic device is formed with the first section on a first further substrate portion and the second photovoltaic device formed with the second section on a second further substrate portion,
   wherein the respective materials of the carrier substrate, the first electrode layer, the photovoltaic layer and the second electrode layer of the first section are the same as those of the carrier substrate, the first electrode layer, the photovoltaic layer and the second electrode layer of the second section;

wherein the first section and the second section have a substantially complementary comb-shape, the first section comprising first parallel strips having a width W and a space of width S between subsequent ones of the first parallel strips, the second section comprising second parallel strips also having a width W and a space of width S between subsequent ones of the second parallel strips, wherein a ratio (S−W)/W is at most 0.2, and wherein the first photovoltaic device is arranged in a first plane and the second photovoltaic device is arranged in a second plane parallel to and in front of the first plane.

6. The translucent photovoltaic product according to claim 5, wherein the first photovoltaic device and the second photovoltaic device are movably arranged with respect to each other along at least one direction defined by the first plane.

7. The translucent photovoltaic product according to claim 6, wherein the first section with which the first photovoltaic device is formed has the first parallel strips extending from a first base, wherein the second section with which the second photovoltaic device is formed has the second parallel strips extending from a second base, and wherein the first photovoltaic device and the second photovoltaic device are movably arranged with respect to each other at least according to a first direction aligned with the first parallel strips and the second parallel strips allowing the second parallel strips of the second section to cover the spaces between the first parallel strips of the first section to an extent defined by the relative position in the first direction.

8. The translucent photovoltaic product according to claim 6, wherein the first section with which the first photovoltaic device is formed has first parallel strips extending from a first base, wherein the second section with which the second photovoltaic device is formed has second parallel strips extending from a second base, and wherein the first photovoltaic device and the second photovoltaic device are movably arranged with respect to each other at least according to a second direction transverse to a direction of the first parallel strips and the second parallel strips allowing the second parallel strips of the second section to cover the spaces between the first parallel strips of the first section to an extent defined by the relative position in the second direction.

* * * * *